(12) United States Patent
Kohno et al.

(10) Patent No.: US 9,207,700 B2
(45) Date of Patent: Dec. 8, 2015

(54) SOLAR POWER SYSTEM AND CONTROL SYSTEM

(75) Inventors: Tohru Kohno, Koganei (JP); Motoo Futami, Hitachiota (JP); Hiromu Kakuya, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 461 days.

(21) Appl. No.: 13/521,672

(22) PCT Filed: Feb. 21, 2011

(86) PCT No.: PCT/JP2011/053700

§ 371 (c)(1),
(2), (4) Date: Jul. 11, 2012

(87) PCT Pub. No.: WO2011/122165

PCT Pub. Date: Oct. 6, 2011

(65) Prior Publication Data

US 2013/0041511 A1 Feb. 14, 2013

(30) Foreign Application Priority Data

Mar. 31, 2010 (JP) .................................. 2010-080095

(51) Int. Cl.
*G06F 1/26* (2006.01)
*G05F 1/67* (2006.01)
*H01L 31/02* (2006.01)

(52) U.S. Cl.
CPC ............ *G05F 1/67* (2013.01); *H01L 31/02021* (2013.01); *Y02E 10/50* (2013.01)

(58) Field of Classification Search
USPC .......................................... 700/286; 363/123
See application file for complete search history.

(56) References Cited

U.S. PATENT DOCUMENTS

2006/0055366 A1    3/2006   Tsunetsugu et al.
2009/0000659 A1    1/2009   Hasegawa et al.

FOREIGN PATENT DOCUMENTS

| JP | 62-85312 A | 4/1987 |
| JP | 9-91050 A | 4/1997 |
| JP | 2001-60122 A | 3/2001 |
| JP | 2006-107425 A | 4/2006 |

(Continued)

OTHER PUBLICATIONS

Femia et al., "Optimization of Perturb and Observe Maximum Power Point Tracking Method" IEEE Transactions on Power Electronics, vol. 20 No. 4 Jul. 2005 pp. 963-973.*

(Continued)

*Primary Examiner* — Mohammad Ali
*Assistant Examiner* — Emilio J Saavedra
(74) *Attorney, Agent, or Firm* — Crowell & Moring LLP

(57) ABSTRACT

In a case in which a local solution to current-voltage characteristics is generated by way of a partial shade, it has been difficult to perform control for causing a solar cell to operate at a maximum power point efficiently in terms of power and at a low cost. During steady state operation, an MPPT control unit 1 for performing the normal hill climbing method is selected, and if the change amount of the output current of the solar cell is greater than or equal to a predetermined threshold, an MPPT control unit 2 for increasing the variation width of the output voltage of the solar cell to greater than the hill climbing method is selected. By way of such control, it is possible to achieve both efficient operation in a steady state and avoidance of a local solution to a partial shade at a low cost.

12 Claims, 16 Drawing Sheets

(56) References Cited

FOREIGN PATENT DOCUMENTS

| JP | 2007-58845 A | 3/2007 |
|---|---|---|
| JP | 2007-311487 A | 11/2007 |

OTHER PUBLICATIONS

Liu et al., "A variable Step Size INC MPPT Method for PV Systems" IEEE Transactions on Industrial Electronics. Jul. 2008 vol. 55 No. 7 pp. 2622-2628.*

Sera et al., "Improved MPPT Algorithms for Rapidly Changing Environmental Conditions" 12th International Power Electronics and Motion Control Conference, 2006. EPE-PEMC Aug. 30, 2006-Sep. 1, 2006 pp. 1624-1619.*

Sharma et al., "Dynamic Power Optimization of Contoured Flexible PV Array Under Non-Uniform Illumination Conditions" IEEE 35th Photovoltaic Specialists Conference (PVSC), Jun. 20-25, 2010. pp. 968-972.*

Wu et al., "DSP-based Multiple Peak Power Tracking for Expandable Power System" IEEE Applied Power Electronics Conference and Exposition, 2003 pp. 525-530.*

Al-Atrash, "Analysis and Design of a Modular Solar-Fed Fault-Tolerant Power System With Maximum Power Point Tracking" University of Jordan Master of Science Thesis, 2005. pp. 1-143.*

Ji et al., "Maximum Power Point Tracking Method for PV Array under Partially Shaded Condition" IEEE Energy Conversion Congress and Exposition, Sep. 20-24, 2009. pp. 307-312.*

Raza et al., "An Improved and Very Efficient MPPT Controller for PV Systems subjected to Rapidly Varying Atmospheric Conditions and Partial Shading" Australasian Universities Power Engineering Conference, 2009. AUPEC 2009, Sep. 27-30, 2009. pp. 1-6.*

T. Esram et al., "Comparison of Photovoltaic Array Maximum Power Point Tracking Techniques", IEEE Transactions on Energy Conversion, Jun. 2007, pp. 439-449, vol. 22, No. 2 (Eleven (11) sheets).

M. Miyatake et al., "Maximum Power Point Tracking Control Employing Fibonacci Search Algorithm for Photovoltaic Power Generation System", Proceedings of International Power Electronics Conference (ICPE'01), pp. 622-625 (Four (4) sheets).

International Search Report dated Apr. 5, 2011 including English-language translation (Three (3) sheets).

International Searching Authority, Written Opinion, Form PCT/ISA/237 with English translation, Apr. 5, 2011 (6 sheets).

* cited by examiner

Prior Art  FIG. 6(a)
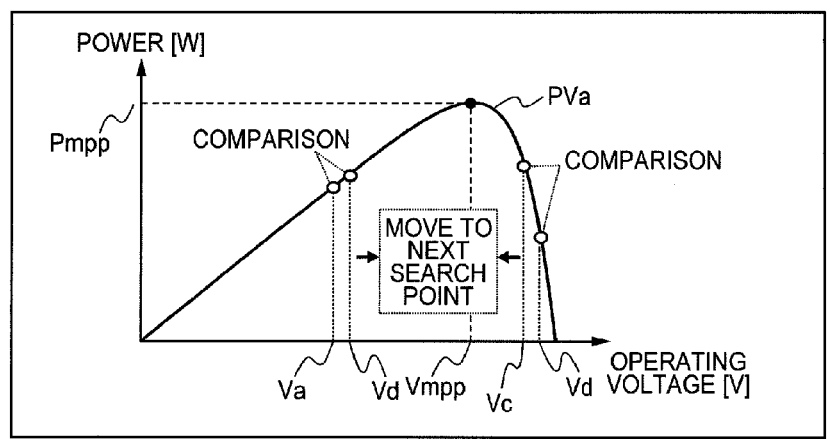
Prior Art  FIG. 6(b)
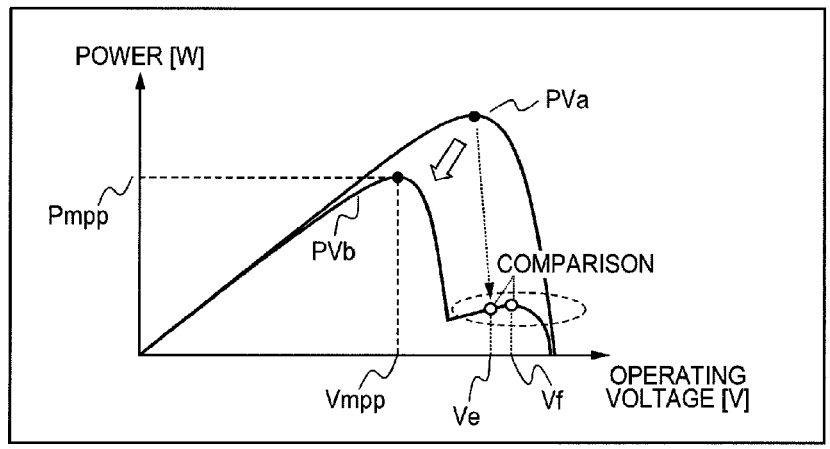

Prior Art   FIG. 7(a)
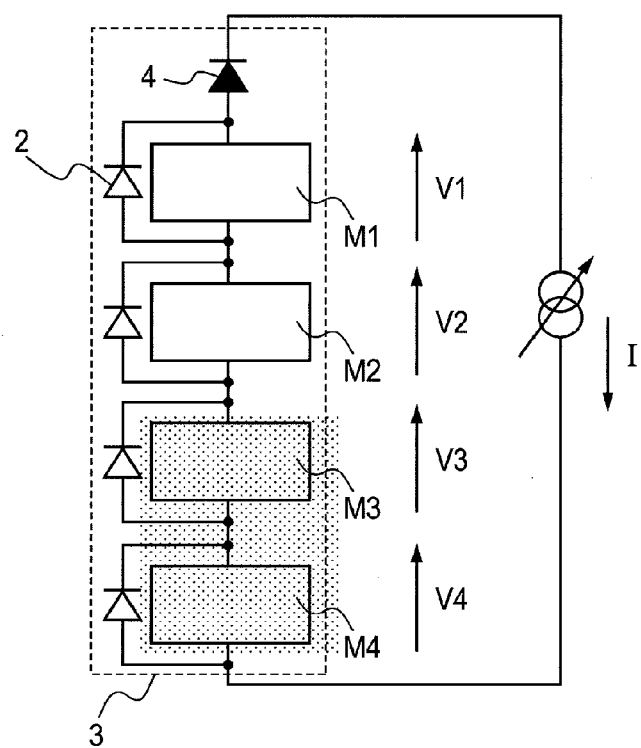

Prior Art FIG. 7(b)
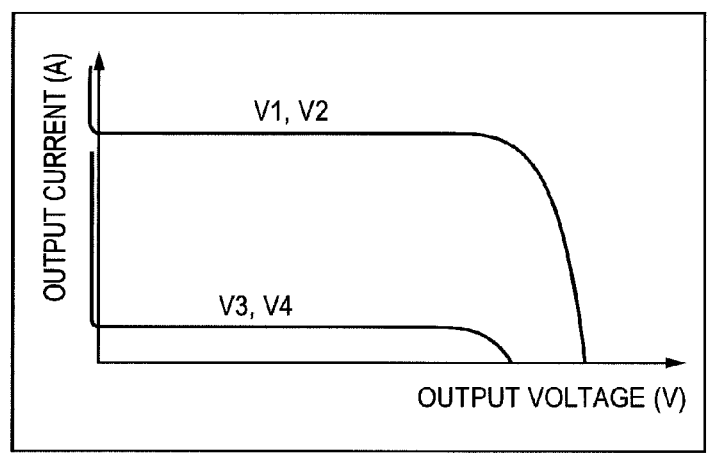
Prior Art FIG. 7(c)
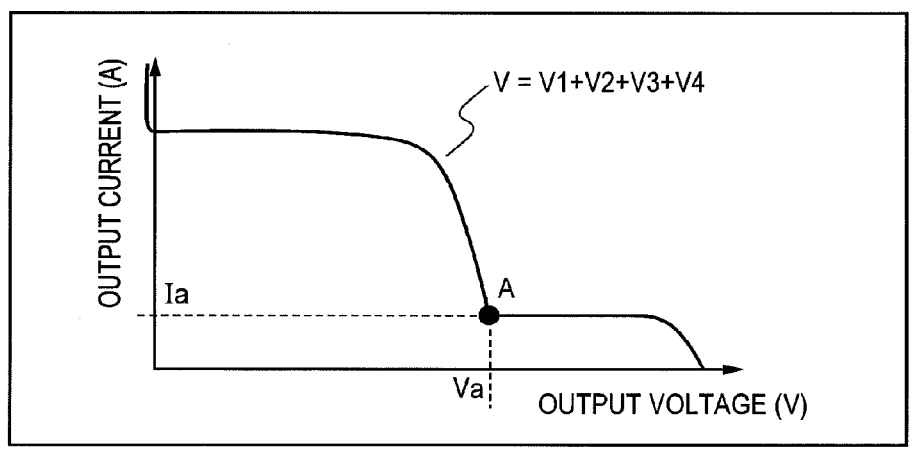

Prior Art  FIG. 7(d)
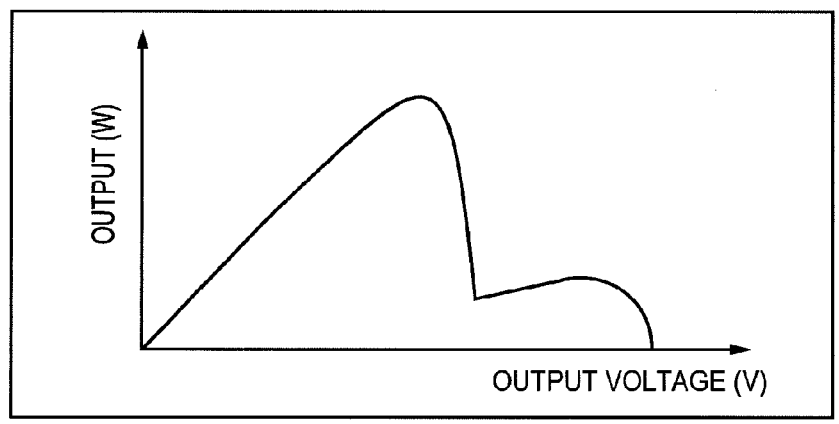

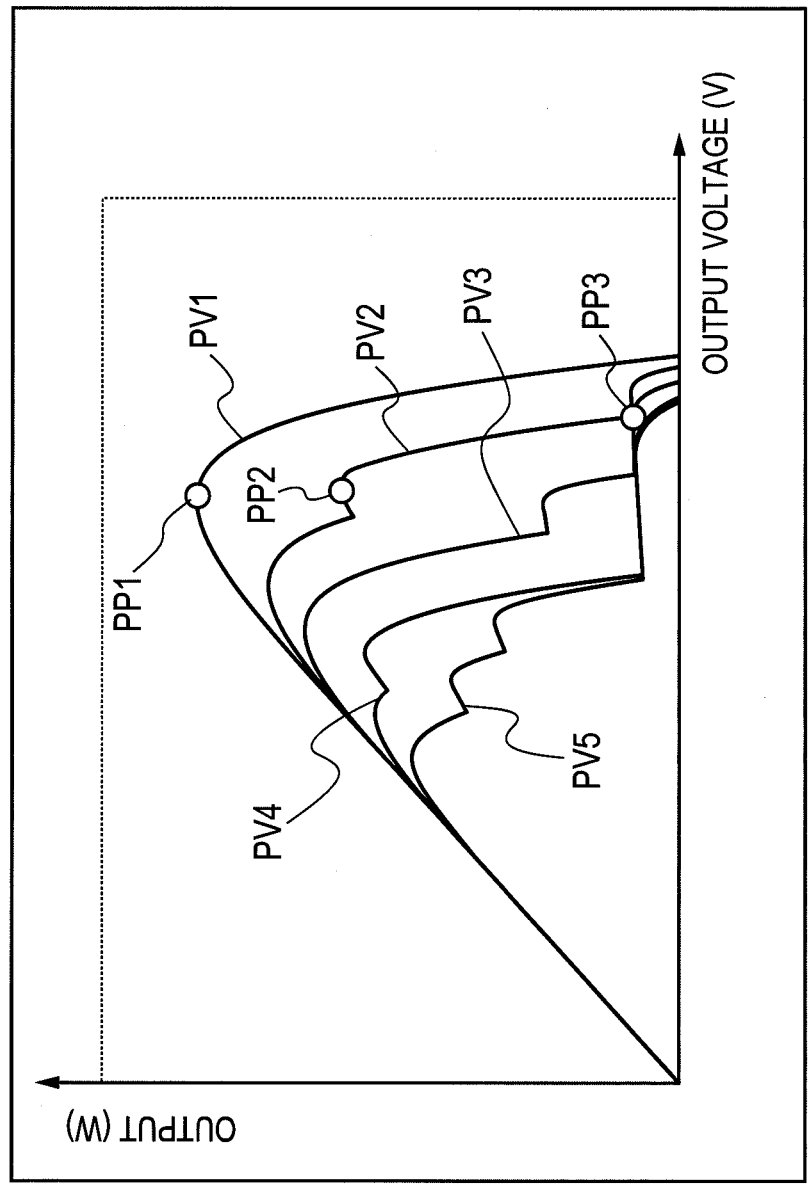

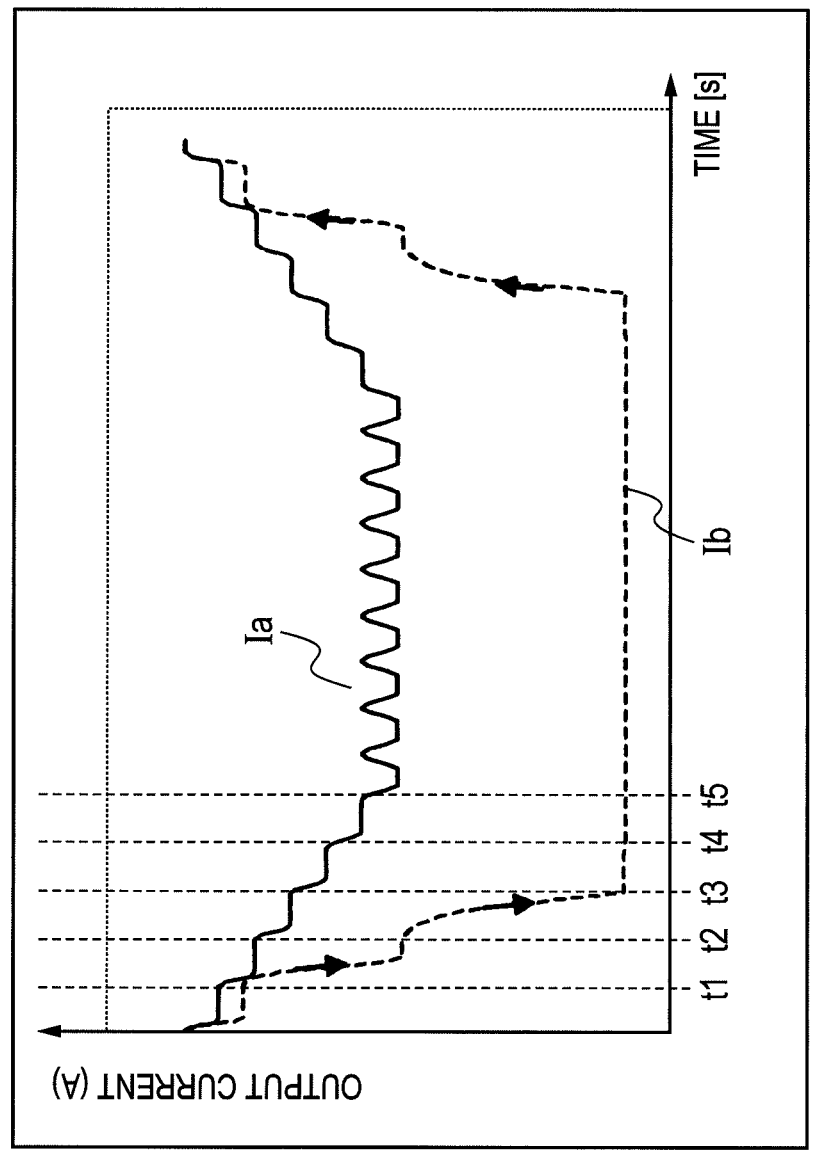

FIG. 9

$$I = I_{ph} - I_o \times \exp\{q \cdot \{(V + I \cdot R_s)/(n \cdot k \cdot T)\} - I_{sh} \quad \cdots \quad (1)$$

$$I_o = C_o \cdot T^3 \cdot \exp\{-(q \cdot E_g)/(n \cdot k \cdot T)\} \quad \cdots \quad (2)$$

I : OUTPUT CURRENT
Iph : CURRENT PROPORTIONAL TO QUANTITY OF SOLAR RADIATION
Ish : LEAK CURRENT
V : OUTPUT VOLTAGE
Rs : SERIES RESISTANCE
n : JUNCTION CONSTANT
k : BOLTZMANN CONSTANT
T : TEMPERATURE
Co : THERMAL COEFFICIENT OF SATURATION CURRENT
q : AMOUNT OF ELEMENTARY CHARGE
Eg : ENERGY GAP

FIG. 10

$$V(I) = V1 + V2 + V3 + V4 \quad \cdots \quad (3)$$

*FIG. 11*

$$dP/dV = I + V \cdot dI/dV \quad \ldots \quad (4)$$

$$|dI/dV| = |I/V| \quad \ldots \quad (5)$$

$$|dI| = |I/V| \cdot |dV| \quad \ldots \quad (6)$$

FIG. 12

$$I/V = \{Iph - Io \times \exp\{q \cdot \{(V+I \cdot Rs)/(n \cdot k \cdot T)\}\} - Ish\}/V \quad \cdots \quad (7)$$

SOLAR POWER SYSTEM AND CONTROL SYSTEM

TECHNICAL FIELD

The present invention relates to a solar power system that controls an output power value from solar cells, and a control system.

BACKGROUND ART

As shown in FIG. 5 of Patent Literature 2, in the conventional solar power system, an output of a solar cell array is controlled by changing a conduction ratio that is a ratio of ON and OFF in a switching operation of a DC/DC converter variably based on voltage information and current information detected by a voltage detector and a current detector. Since the output from a solar cell panel is DC, the output is connected to a commercial system power supply through a DC/AC inverter circuit.

<Outline of Hill Climbing Method>

FIG. 6(a) is a conceptual diagram of a maximum power point tracking control method called a hill climbing method that is generally used in order to obtain an efficient electric power from the solar power system. Hereafter, the maximum power point tracking system is termed an MPPT control (Maximum Power Point Tracking).

First, the DC/DC converter is operated to measure an output voltage Va of the solar cell array as an output set value of an initial solar cell array characteristic. Simultaneously, a solar cell output current outputted according to the output voltage value of the solar cell panel is measured. An MPPT control unit computes an output power Pa of the solar cell panel by multiplying the output voltage Va and an output current, and makes memory memorize it. Next, the DC/DC converter is operated so that its output voltage is set to a voltage Vb larger than the output voltage Va by a predetermined quantity, and similarly, a measurement of a solar cell output current and computation of an output power Pb of the solar cell panel are performed and the memory is made to memorize them. The MPPT control unit compares the memorized output voltages Pa and Pb, and if Pb is a larger value than Pa, will make the DC/DC converter operate so that the output voltage is set to a voltage larger than the output voltage Vb by a predetermined quantity. If the comparison result of the output power being memorized is reverse, which is a relationship shown by the output powers Pc and Pd, the MPPT control unit will make the DC/DC converter operate so that the output voltage is set to a voltage smaller than the output voltage Vc by a predetermined quantity.

This series of operations performs tracking of a maximum power point MPP by making the conduction ratio of the DC/DC converter variable, and is termed a hill climbing method from how to track it, and since it is a simple and easy-to-handle algorithm, it is a method that is currently used most in the solar power system. An MPPT control algorithm using this hill climbing method is described, for example, in Nonpatent Literature 1.

<Reason of Having Multiple Local Solutions>

Here, as shown in FIG. 6(b), when the partial shade comes to cast on the solar cell array, a characteristic of the solar cell array may change from PVa to PVb, and may have multiple local extrema in a voltage vs. power characteristic of the solar cell. A main factor by which when the partial shade is cast on the solar power system, it comes to have a characteristic with multiple local solutions will be explained below.

FIG. 7 is a diagram showing that when the partial shade is cast on the solar power system, it comes to have a characteristic with multiple local solutions. Now, consider a string formed by connecting four solar cell modules shown by M1 to M4 in series, as shown in FIG. 7(a).

FIG. 7(b) shows a current vs. voltage characteristics (I-V characteristics) of each module for the modules M3, M4 in which the shadow is cast and for the modules M1, M2 in which no shadow is cast, and FIG. 7(c) shows a current vs. voltage characteristic of the whole string. As shown in FIG. 7(b), it can be understood that an open circuit voltage for V3 and V4 computed in a portion where the shadow is cast becomes also smaller than that for V1 and V2 computed in a portion where no shadow is cast.

Moreover, regarding all the modules, when a reverse bias (a forward bias for by-pass diodes) is applied, the by-pass diodes turn ON and resistance components become zeros. Then, since after the by-pass diodes turned ON, the output voltages of the modules M3, M4 become zeros, the current vs. voltage characteristic of the modules M3, M4 becomes a waveform whose output voltage is always zero when the output current is more than or equal to a predetermined output current, as shown in FIG. 7(b). As a result, the modules M3, M4 will become different from the modules M1, M2 on which no shadow is cast (the by-pass diodes are OFF) in the current vs. voltage characteristic.

Then, when seeing the voltage of the whole string, a voltage condition in which the by-pass diodes start ON operations changes because of a voltage difference between the portion on which the shadow is cast and the portion on which no shadow is cast at a certain current. Therefore, as shown in FIG. 7(c), the string will show a discontinuous current vs. voltage characteristic in a point (point A of FIG. 7(c)) in which the output current exceeds the predetermined value (Ia) and the by-pass diodes of the modules M3, M4 turn ON. Here, if a power vs. voltage characteristic is obtained, since electric power is a product of voltage and current, the power of the whole string will show a characteristic with multiple extrema as shown in FIG. 7(d). As was explained above, when the partial shade is cast in the direction of the string, since the current vs. voltage characteristic is different between the modules (M1 and M2) on which no partial shade is cast and the modules (M3 and M4) on which the partial shade is cast, the power vs. voltage characteristic of the whole string will have multiple local solutions. In this case with the multiple local solutions, as shown in FIG. 6(b), since the hill climbing method may fall into a comparison operation around Ve, Vf, the local solution becomes a real operation point, which may bring a possibility that a power efficiency falls.

<Conventional Measure to Multiple Local Solutions>

Since when the power vs. voltage characteristic of the whole string has multiple local solutions, there is a case where the string cannot be operated at a maximum power by the hill climbing method, as was described in detail above, many MPPT control algorithms have been proposed besides the hill climbing method.

As a prior literature of the MPPT control algorithm by which a maximum value of a small mountain that is not the maximum power is avoided even when tracking to the maximum power point is performed, for example, in Patent Literature 1, the MPPT control that has introduced a genetic algorithm being an optimization problem is performed. Moreover, in Nonpatent Literature 2, the MPPT control that has introduced a scheme of making a search width of the hill climbing method variable using a Fibonacci search, rather than a computationally complex algorithm such as a generic algorithm, is performed.

Moreover, as a prior literature for always obtaining the maximum efficiency even under an uneven solar radiation condition by performing the MPPT control for every solar cell module, rather than for every solar cell string, there is Patent Literature 2. With Patent Literature 2, since a tracking control is performed by switching control of a charge transfer circuit provided for every solar cell module so as to track the maximum power point, regarding the solar power array in which the multiple solar cell modules are connected in series or in parallel, it is possible to always output the maximum power to a load side.

Patent Literature 3 discloses means for reconstructing a characteristic having the partial shade by comparing multiple standard characteristics that are data-based in memory 52 and a predetermined standard state obtained through conversion of a voltage, a solar cell surface temperature, a pyrheliometer, an outdoor air temperature, values measured by a measurement unit, such as a reference cell, and subsequently by assuming a current state of the solar cells as a most approximated characteristic.

CITATION LIST

Patent Literatures

Patent Literature 1: Japanese Unexamined Patent Application Publication No. 2006-107425
Patent Literature 2: Japanese Unexamined Patent Application Publication No. 2007-58845
Patent Literature 3: Japanese Unexamined Patent Application Publication No. 2007-311487

Nonpatent Literatures

Nonpatent Literature 1: IEEE TRANSACTIONS ON ENERGY CONVERSION, VOL. 22, No. 2, 2007, pp. 439-449
Nonpatent Literature 2: international Power Electronics Conference (1CPE'01), pp. 622-625

SUMMARY OF INVENTION

Technical Problem

In order to solve a problem of the local solution that is not MPP, as in Patent Literature 1 and Patent Literature 2, in the MPP control to which an optimization problem that uses a genetic algorithm, a Fibonacci search, or the like is applied, a number of powers at the operating voltages in a wide range are acquired; therefore, as a result, there is a problem that operations at points other than a maximum power point increase in number, and performance in a steady state with no partial shade becomes worse. That is, in an MPPT control using a hill climbing method, performance in a steady state is excellent, but there is a risk of falling into a local solution; in the MPPT control using the optimization problem, it is possible to avoid the local solution, but a power efficiency in a steady state deteriorates. Therefore, it is necessary to shorten a period of performing the MPPT control to which the optimization problem is applied as much as possible, and to perform the MPPT control by the hill climbing method as much as possible.

Furthermore, a technology of performing the MPPT control for every solar cell module, like Patent Literature 2 and Patent Literature 3, comes with a problem that a cost becomes high because the circuit is provided for every solar cell module.

Especially in an invention according to Patent Literature 2, since a circuit for searching for the maximum power point is incorporated in every solar cell module, there is a problem that the cost becomes high. Moreover, since the search circuit is connected in series to the string in the solar cell module, there is also a problem that if the search circuit malfunctions, the whole string stops functioning.

Moreover, in an invention according to Patent Literature 3, it is necessary to incorporate a measurement unit of a voltage, a solar cell surface temperature, a pyrheliometer, an outdoor air temperature, a reference cell, etc. for every module and memory for storing information of those, but a measurement unit like this is expensive, and there is a problem that the cost becomes high all the same.

Therefore, an object of the present invention exists in realizing a control of the solar cells whose power efficiency is more excellent while suppressing an increase of the circuit cost.

Solution to Problem

Enumerating typical ones among means for solving the problem according to the present invention, they are as follows.

The first one is a solar power system that comprises: solar cells; a voltage control unit for controlling the output voltage of the solar cells; a voltage detection unit for detecting the output voltage of the solar cells; a current detection unit for detecting the output current of the solar cells; a first control unit that makes the voltage control unit vary the output voltage within a first variation width and compares the output voltages of the solar cells before and after the variation; a second control unit that makes the voltage control unit vary the output voltage within a second variation width that is larger than the first variation width and compares the output voltages before and after the variation; and a comparison unit for comparing an absolute value of the change amount per unit time of the current detected by the current detection unit and a predetermined threshold; in which if the comparison unit determines that the absolute value of the change amount is smaller than the predetermined threshold, the first control unit will be selected, and if the comparison unit determines that the absolute value of the change amount is larger than the predetermined threshold, the second control unit will be selected.

The second one is a control system for controlling the solar cells that comprise: a first control unit that varies the output voltage of the solar cells within the first variation width and compares the output voltages before and after the variation; a second control unit that varies the output voltage of the solar cells within the second variation width that is larger than the first variation width and compares the output voltages before and after the variation; and a comparison unit for comparing the absolute value of the change amount per unit time of the output current of the solar cells and the predetermined threshold; wherein if the comparison unit determines that the absolute value of the change amount is smaller than the predetermined threshold, the first control unit will be selected, and if the comparison unit determines that the absolute value of the change amount is larger than the predetermined threshold, the second control unit will be selected.

Advantageous Effects of Invention

According to the present invention, it is possible to operate solar cells more efficiently.

BRIEF DESCRIPTION OF DRAWINGS

FIG. 5(a) is a diagram showing a situation of an MPPT control by the solar power system of the present invention.

FIG. 5(b) is a diagram showing a situation of the MPPT control by the solar power system of the present invention.

FIG. 5(c) is a diagram showing a situation of the MPPT control by the solar power system of the present invention.

FIG. 5(d) is a diagram showing a situation of the MPPT control by the solar power system of the present invention.

FIG. 5(e) is a diagram showing a situation of the MPPT control by the solar power system of the present invention.

FIG. 6(a) is a diagram showing an MPPT control by a hill climbing method.

FIG. 6(b) is a diagram showing the MPPT control by the hill climbing method when a partial shade is cast on solar cells.

FIG. 7(a) is a schematic diagram when the partial shade is cast on a solar cell string.

FIG. 7(b) is a diagram showing a difference of a current vs. voltage characteristic between a solar cell module on which the shadow is cast and a solar cell module on which no shadow is cast.

FIG. 7(c) is a diagram showing a current vs. voltage characteristic of the solar cell string on which the partial shade is cast.

FIG. 7(d) is a diagram showing a power vs. voltage characteristic of the solar cell string on which the partial shade is cast.

FIG. 8(b) is a diagram showing a temporal variation of the power vs. voltage characteristic when the partial shade is cast on the solar cell array.

FIG. 8(c) is a diagram showing a temporal variation of an output current when the partial shade is cast on the solar cell array.

FIG. 9 is a diagram showing the output current of the solar cell module.

FIG. 10 is a diagram showing an output voltage of the solar cell string.

FIG. 11 is a diagram showing a relationship of the output voltage and the output current of the solar cell string.

FIG. 12 is a diagram showing a relationship of the output voltage and the output current of the solar cell string.

DESCRIPTION OF EMBODIMENTS

Figure 1A:
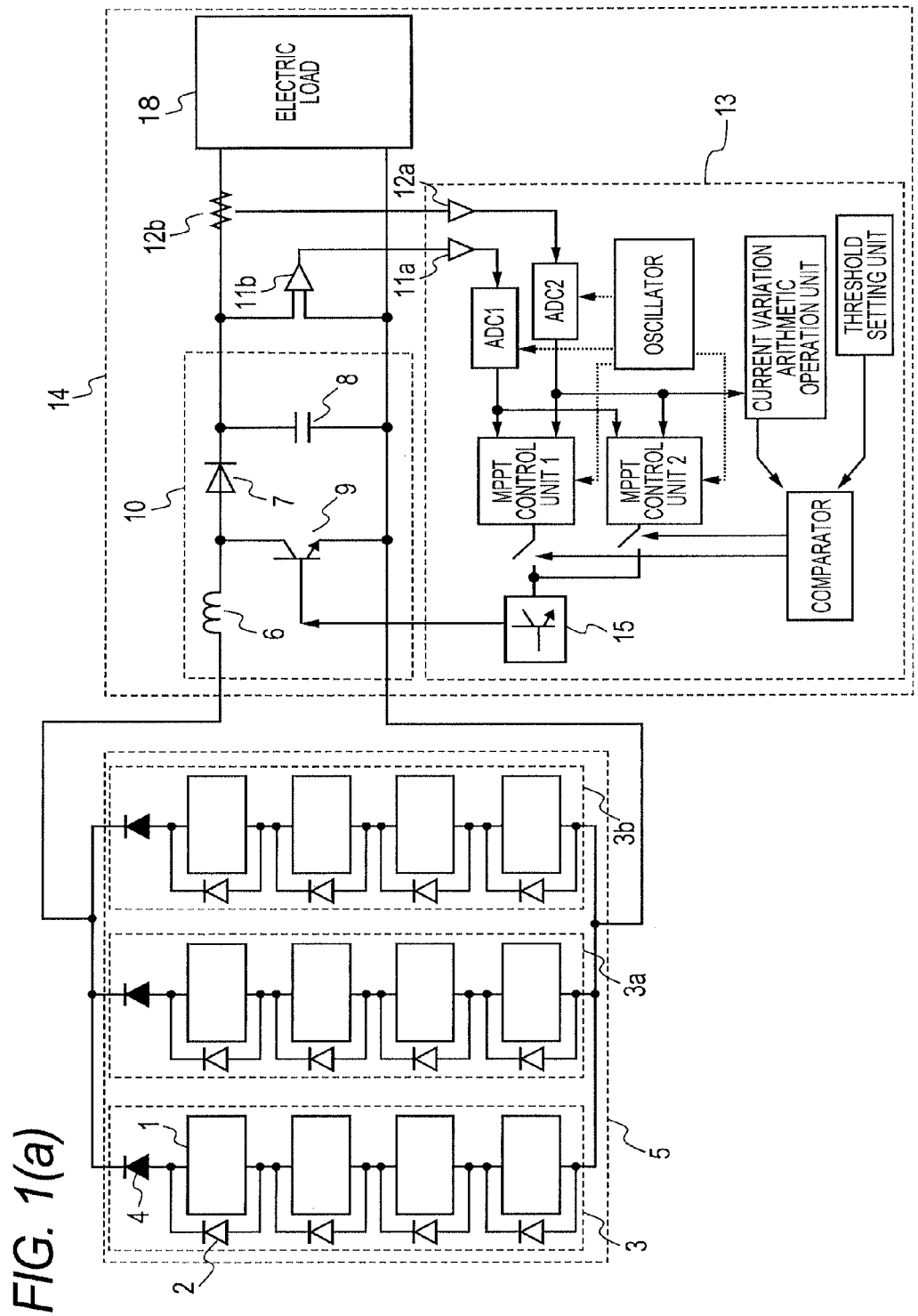
FIG. 1(a) is a diagram showing an entire configuration of a solar power system according to a first embodiment of the present invention.

In describing embodiments, definitions of terms used in the description of this application will be explained. In the following embodiments, a "solar cell module" shall refer to a unit in which solar power generation is performed, as shown in 1 of FIG. 1(a) and shall refer to a unit to which a by-pass diode 2 is attached in parallel, A "solar cell string" shall refer to a unit formed by connecting the multiple solar cell modules in series, as shown by 3 of FIG. 1(a). A "solar cell array" shall refer to a unit in which the multiple solar cell strings are connected in parallel, as shown by FIG. 1(a).

First Embodiment

In order to solve problems of the conventional technologies enumerated as cited references, the inventors of this application paid attention to a transitional behavior that becomes a characteristic with multiple local solutions.

Figure 8A:
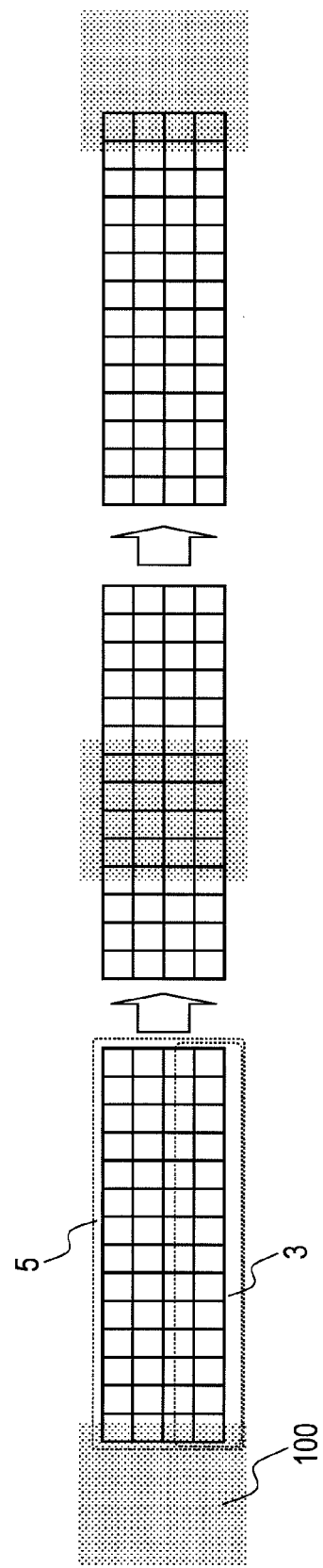
FIG. 8(a) is a schematic diagram showing a situation where the partial shade is cast on a solar cell array.

FIG. 8 schematically shows a variation of a characteristic of the solar cell array when a shadow 100 is moving in a direction parallel to the string that is a main factor of the multiple local solutions caused by a cloud moving at a some wind speed with respect to the solar cell array in which four strings each formed by connecting 14 solar modules in series are connected in parallel (56 sheets). A portion that is gray hatched shows a portion where the shadow is cast on the string by a cloud. A reason why a/the partial shade by such a cloud is examined is that since a large-scale power generation system such as a Mega Solar is often installed in a vast environment that does not have large buildings around itself, the shadow by a could as shown in FIG. 8(a), rather than the buildings, becomes a large problem. However, it goes without saying that what the invention of this application is applied to is not limited to such a partial shade caused by the cloud, and it can be applied to general partial shade of a building etc.

When time passes with regular intervals from a moment the shadow starts to be cast, as at t1, t2, t3, t4 and t5, the characteristic changes, as shown in FIG. 8(b), which goes a characteristic PV1 of the solar cells at t1, a characteristic PV2 of the solar cells at t2, a characteristic PV3 of the solar cells at t3, a characteristic PV4 of the solar cells at t4, and a characteristic PV5 of the solar cells at t5. In this case, since when a conventional hill climbing method is used, a tracking point changes as it goes to PP1, PP2, and PP3, the operation settles down near a local solution that is not a maximum power point, and power generation efficiency will fall. Here, let attention be paid to a temporal variation of the output current of the whole solar cell array as shown in FIG. 8(c). Ia stands for a monitored temporal variation of the output current of the solar cell array when a theoretical maximum power point is achieved, and Ib stands for a monitored temporal variation of the output current of the solar cell array tracked by the conventional MPPT control.

Comparing FIG. 8(b) and FIG. 8(c) shows that when the solar cell array falls into an operation at a local solution that is not the maximum power point, the variation of the output current is extremely large as compared with the usual variation. Based on this, the inventors of this application have obtained a finding that the problem by the partial shade can be solved by the following circuit configuration without worsening an operating efficiency in a steady state and without increasing a circuit cost excessively.

FIG. 1(a) is a block diagram of a solar power system according to a first embodiment of the present invention. A solar cell array 5 is configured by aligning, in parallel, units each called the string 3 formed by aligning the multiple solar cell modules 1 in series. The by-pass diode 2 is attached to the each solar cell module 1 in order to prevent a reverse current from flowing when a reverse bias is applied, and also a reverse flow preventing diode 4 is attached to each unit of the string in order to prevent a current from flowing thereinto in a reverse direction.

In order to control the output voltage of this solar cell array, a DC/DC converter circuit is used. The DC/DC converter circuit was realized by a boost chopper 10 that was comprised of a coil 6, a diode 7, a capacitor 8, and a switching element 9, and controls the output voltage of the solar cell array by changing variably a conduction ratio that is a ratio of ON and OFF in the switching operation of the switching element 9.

A control signal with a certain conduction ratio is generated in an MPPT control unit in a control unit 13 and is transmitted to a gate electrode of the switching element 9 through a level shifter 15. A CPU or DSP that has a built-in power electronics OS (PEGS) is used in the MPPT control unit.

Moreover, a sensor 11b is a voltage detector for detecting the output voltage of the solar cell panel, and a sensor 12b is an output current detector for detecting an output current of the solar cell. Detected voltage information and current information are converted to digital values by an AD converter ADC1 and an AD converter ADC2 after being subjected to impedance conversion through a buffer 11a and a buffer 12a, respectively, and then are transmitted to the MPPT control unit. Thereby, it is possible to control the conduction ratio while feeding back the output of the solar cell panel.

Since the output from the solar cell array is DC, it is connected to a commercial system power supply through a DC/AC inverter circuit. The inverter circuit and the commercial system power supply can be considered to play a role of an electric load 18 in the solar cell system. Generally, a device from the solar cell array to a connection of the commercial system power supply is a power conditioner 14.

Since the output current of the solar cell is detected by the sensor 12b and is converted into a digital value by the AD converter ADC2, a variation per unit time of the output current can be calculated by a current variation arithmetic logical unit using this information. A threshold that was set in advance in a threshold setting unit and the calculated result are compared, and if an absolute value of the variation does not exceed the threshold, an MPPT control unit 1 will be selected and the output of the solar cell array will be controlled. On the contrary, if the absolute value of the current variation exceeds the threshold, an MPPT control unit 2 will be selected.

Here, what the MPPT control unit 1 should do is just to perform a control such that the output voltage of the solar cell array is varied within a first variation width and the output voltage is compared before and after the variation, the hill climbing method corresponding to this control, for example. On the other hand, what the MPPT control unit 2 should do is just to perform a control such that the output voltage of the solar cell array is varied within a second variation width that is lager than the first variation width and the output voltage is compared before and after the variation, and an MPPT control that makes a search width variable, such as a generic algorithm and a Fibonacci search, corresponds to this, for example. Here, the "variation width" means an absolute value of a difference of the output voltage before the variation and the output voltage after the variation.

Here, the above-mentioned two kinds of MPPT controls have following features. Since in the control by the MPPT control unit 1, the variation width of the output voltage is relatively small, the solar cell array is made to operate in the vicinity of the maximum power point, but there is a problem that the control falls into a local solution when the partial shade arises in the solar cell array. On the other hand, in the control by the MPPT control unit 2, the variation width of the output voltage is relatively large, although even if partial shade takes place, the control does not fall into a local solution and the maximum power point can be searched; but there is a problem that a period during which the output voltage is controlled to be a voltage away from the maximum power point becomes long, and the operating efficiency deteriorates.

On the other hand, the invention according to the first embodiment has: a first control unit that varies the output voltage of the solar cell within the first variation width and compares the output voltages of the solar cells before and after the variation; a second control unit that varies the output voltage of the solar cell within the second variation width that is larger than the first variation and compares the output voltages of the solar cells before and after the variation; and a comparison unit for comparing an absolute value of the change amount per unit time of the output current of the solar cells and a predetermined threshold; in which if the comparison unit determines that the absolute value of the change amount is smaller than the predetermined threshold, the first control unit will be selected, and if the comparison unit determines that the absolute value of the change amount is larger than the predetermined threshold, the second control unit will be selected.

Here, in this embodiment, the solar cell array is assumed as the solar cells (it may differ in embodiments after this). Moreover, the output voltage is obtainable from a voltage detection unit, such as the sensor 11b, the output current is obtainable from a current detection unit, such as the sensor 12b, and the output power can also be obtained by multiplying these.

By having this configuration, the solar power system has the following effect. As described above, since the inventors of this application have acquired a finding that the existence/absence of the partial shade can be determined by the change amount of the output current, if the change amount of the output current does not exceed the predetermined threshold, it will be possible to determine that the partial shade is not cast on the solar cell array. Therefore, in this case, the solar cell array can be operated more efficiently by selecting the MPPT control unit 1. On the other hand, if the change amount of the output current exceeds the predetermined threshold, it will be possible to determine that the partial shade is cast on the solar cell array, and therefore it will be possible to prevent the MPPT control from falling into a local solution by selecting the MPPT control unit 2.

Moreover, such a control is realizable with general circuits, such as a comparator, the current variation arithmetic logical unit, and the threshold setting unit. Therefore, a cost originating when a measurement unit is incorporated to the solar cell does not become a problem.

FIG. 5 makes more concrete a function of selecting an MPPT control 1 and an MPPT control 2.

First, as shown in FIG. 5(a), consider a state where the operating voltage is first controlled by the MPPT control 1, comes and goes around Vg, Vmpp, and Vh (hereinafter, a variation width of Vg and Vmmp and a variation width of Vmmp and Vh (a variation width 1) are denoted as the first variation width), and tracks the maximum power point.

Next, as shown in FIG. 5(b), let it be assumed that the partial shade is cast and a characteristic of the solar cells suddenly changes to a characteristic with multiple local solutions. In this case, since a rapid variation of current takes place, as was described above, the variation is perceived and the control method is changed to the MPPT control 2 from the MPPT control 1. Here, in the following explanation, there is given, as an example, a case of a control in which the Fibonacci search, which is one of search-variable techniques, whereby the search width is once widened to the operation voltages Vh, Vi as shown in FIG. 5(c), and tracking is again performed while the search width is changed variably is applied, as the MPPT control 2. However, what is necessary is just to perform a control that makes at least a variation width (the second variation width) between Vh and Vi larger than a variation width between Vg and Vmmp and a variation width between Vh and Vmmp (the first variation width), and the techniques are not limited to the Fibonacci search. Then, when the operating voltage becomes voltages Vi, Vj and a value of the Fibonacci search sequence indicating the search width of the Fibonacci search becomes sufficiently small after continuing the Fibonacci search several times as shown in FIG. 5(d), the control method is returned to the MPPT1, i.e., the hill climbing method, and the operating voltage is made to come and go around Vi, Vmppl, and Vj, always being made to operate at the maximum power point.

By performing this control, even when the partial shade arises as shown in FIG. 5(e), finally an operation at the maximum power point is realized, as shown in FIG. 5(b). In addition to this, since it is operating by the MPPT control 1 as shown in FIG. 5(a) and FIG. 5(e) in a steady state, there is a less loss of the electric power caused by searching a point other than the maximum power point as compared with a control that always performs the Fibonacci search. Furthermore, circuits to be added in order to realize this function are the MPPT control unit 2, the comparator, the current variation arithmetic logical unit, the threshold setting unit, etc., and in fact, since they are realizable as parts of functions, such as of a CPU and a DSP, an additional cost can be suppressed as compared with incorporation of the measurement unit etc. separately.

As a result, as compared with the conventional technology, it becomes possible to realize two advantages simultaneously: performing an operation near a maximum power in a steady state; and when the partial shade arises, the control is prevented from falling into a local solution. Furthermore, it becomes possible to realize a cost for it at a low rate.

Here, an example of setting the threshold will be described below. The output currents of respective modules are expressed by Formulas (1) and (2) described in FIG. 9.

k, q, and Eg are constant values and n and Co are values that depend on the solar cell device characteristic and are values managed as device parameters. Rs (series resistance) is a value that will become clear by measurement of the solar cell. When Ish is decided by solving simultaneous equations from these parameters plus an open circuit voltage, a short-circuit current, an output current and an output voltage at the time of MPP obtained from static characteristics of the solar cell device, Formula (1) can be expressed by an equation having I, Iph, V, and T as parameters. Even if there are unknown parameters in the device characteristics of the solar cell, such as n and Co, Formula (1) can be expressed by a formula using I, Iph, V, and T as parameters by applying a Newton's method etc.

Figure 10:
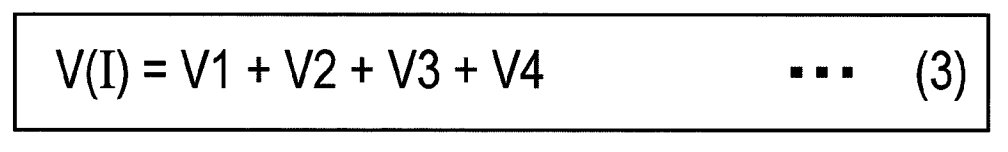

With respect to an analysis of the string, since the current I flowing in four modules is common, what is necessary is to find the module voltages when the current I is flowing from Formulas (1), (2) and find a sum V of them. That is, a voltage V(I) of the whole of one string is Formula (3) described in FIG. 10.

A by-pass diode for preventing a current from flowing in a reverse direction when the reverse bias is applied thereto is attached to each solar cell module. Moreover, in Formulas (1), (2), since V is obtained from I, an inverse function need to be computed. Computation of the inverse function that takes in a model of the by-pass diode can be easily performed using the Newton's method. Since the maximum power point is a point where dP/dV=0 holds, a relationship as shown in Formula (6) can be obtained from Formula (4), as described in FIG. 11. |dV| is a known value because it is a variation width of the boost chopper, and a relationship as shown in Formula (7) described in FIG. 12 can be obtained from Formula (1).

Here, Iph and T that are included in Formula (7) can be determined using values acquired from the pyrheliometer and the thermometer incorporated in the Mega Solar, and V is an operating voltage that the boost chopper 10 decides and can be computed by the AD converter ADC1. Other variables are physical parameters and their parameter values are values that can be decided by fitting etc. although there are some dispersions depending on a device that is included in the solar cell module. Moreover, I/V is computable also from values detected by the AD converter ADC1 and the AD converter ADC2.

Thus, if a value larger than at least |dI| is set as the threshold on the basis of |dI| that was found by Formula (6), it is possible to determine that a local solution arose. Therefore, an effect of preventing the local solution can be produced by switching to the MPPT control 2. Regarding the threshold, what is necessary is just to set a value of 2×|dI| as the threshold, for example.

Thus, the threshold of the invention of this application can be decided based on the output voltage, the output current, and the voltage width that is the search width. Since deciding the threshold in this case can be realized by a current sensor and a voltage sensor that are incorporated in the system being used conventionally and the power generation efficiency can be raised while the cost of a present system is kept as it is, this produces a large effect in respect of a power generation cost.

Figure 1B:
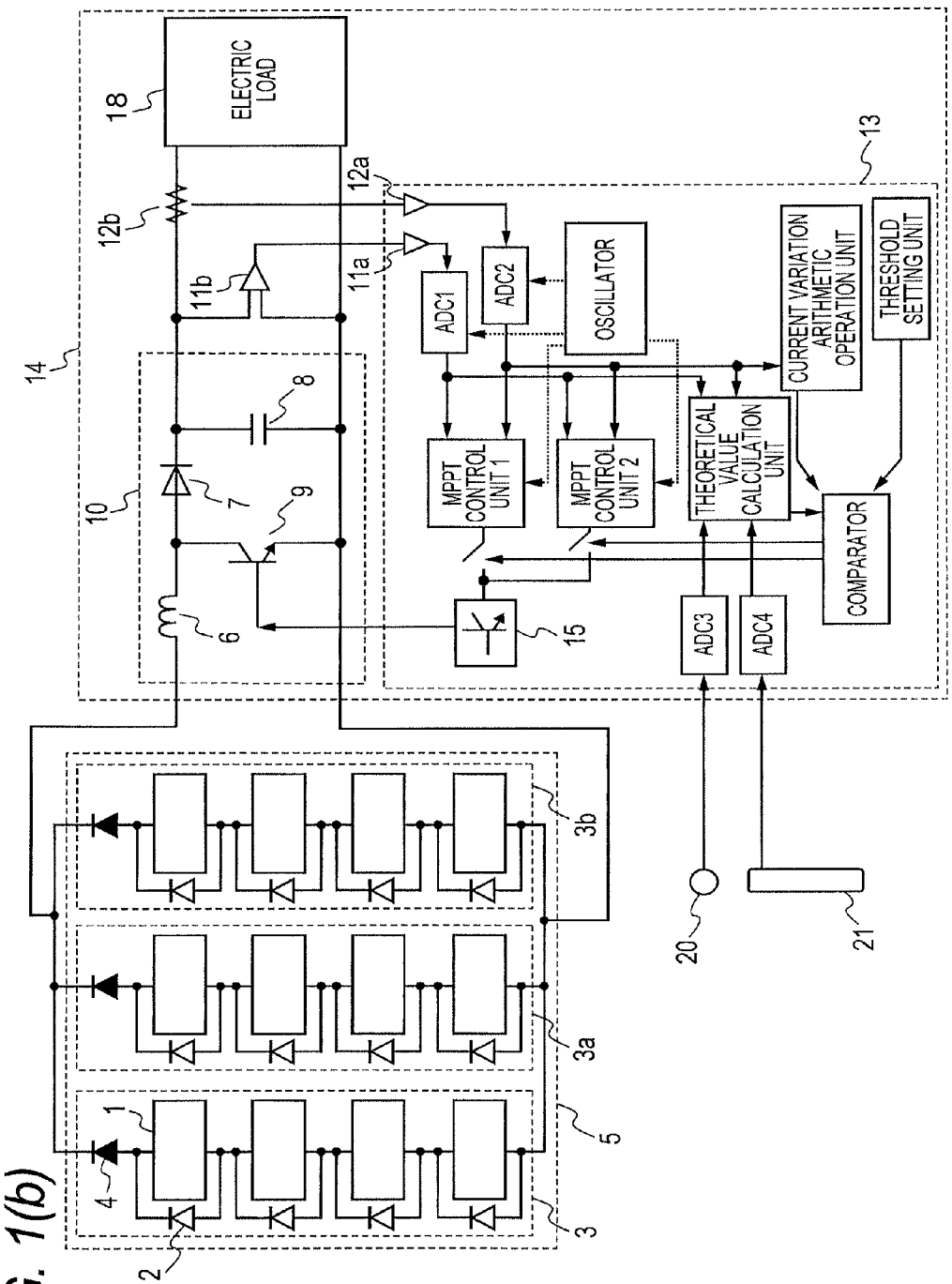
FIG. 1(b) is a diagram showing the entire configuration of the solar power system according to the first embodiment of the present invention.

Moreover, as shown in FIG. 1(b), the threshold can also be determined based on values acquired from a pyrheliometer 20 and a thermometer 21. In large-scale power generation like the Mega Solar, measuring instruments, such as the pyrheliometer and the thermometer, are installed at a measurement site. A quantity of solar radiation that is irradiated to the solar cell array can be measured from the pyrheliometer, and a solar cell array temperature can be inferred from temperature information measured by the thermometer by JIS C 8907. These pieces of information are digital converted by an AD converter ADC3 and an AD converter ADC4, and the theoretical value prediction unit can predict an operation point in a state where there is no partial shade from Formula (1), Formula (2), and digital information of the current sensor and the voltage sensor. Therefore, by performing a comparison operation on a predictive value and |dI| that was found by the measurement result and Formula (6), a prediction accuracy of the characteristic can be improved.

Second Embodiment

Figure 2:
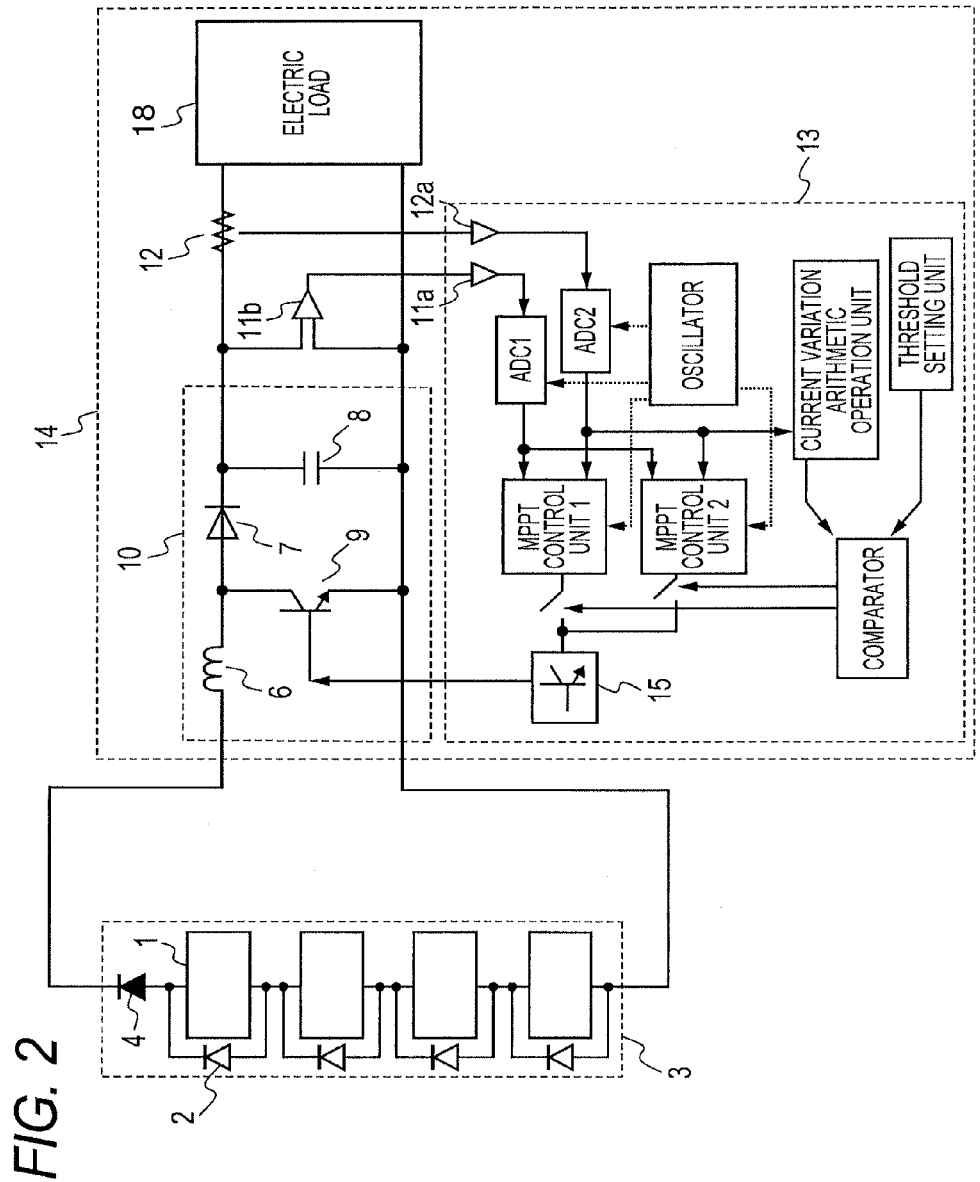
FIG. 2 is a diagram showing an entire configuration of a solar power system according to a second embodiment of the present invention.

FIG. 2 is a block diagram of a solar power system according to a second embodiment of the present invention. In the figure, since this system is the solar power system shown in FIG. 1(a) with the solar cell array therein replaced with a string formed by connecting the solar cell modules in series, any component of the same symbol as that of FIG. 1(a) performs the same operation and therefore its explanation is omitted.

As described above using FIG. 7, the main factor by which the solar power system has a characteristic with multiple local solutions is the partial shade cast on a string formed by connecting the solar cell modules in series. Therefore, the same effect as that of the invention according to the first embodiment can be achieved also by controlling the solar cell modules by the string as shown in FIG. 2. Furthermore, since the number of the solar cell modules included in an object that should be controlled becomes less than the case according to the first embodiment, this embodiment has a merit of being impervious to an influence of dispersion of the solar cell modules. In order to perform the control for every string in the case of this embodiment, the cost increases to some extent as compared to a case of performing the control for every array, but when the influence of the dispersion is larger than this difference, especially this embodiment becomes effective. Moreover, when comparing this with a case of performing a control for each module, the cost will not become large.

Third Embodiment

Figure 3:
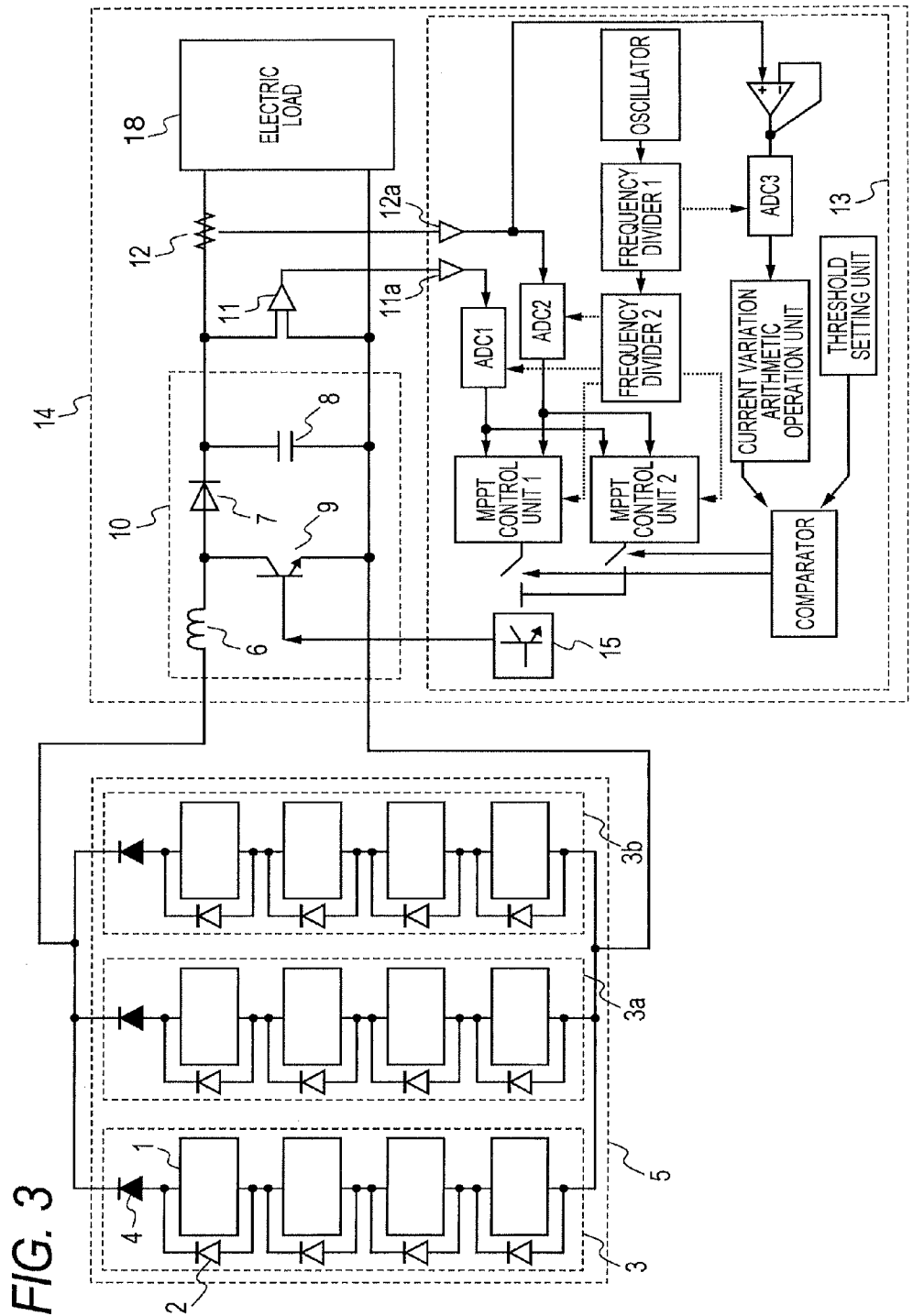
FIG. 3 is a diagram showing an entire configuration of a solar power system according to a third embodiment of the present invention.

FIG. 3 is a block diagram of a solar power system according to a third embodiment of the present invention. Like FIG. 1(a), the threshold setting unit compares a previously set threshold and a computation result indicating a variation of the output current that was converted into a digital value by the AD converter ADC2.

An operation of detecting it with the sensor 12b and converting it into a digital value with the AD converter ADC2 is for allowing the MPPT control unit 1 to perform the hill climbing method, and a sampling rate is restrained by performance of the boost chopper 10, etc. On the other hand, as was explained in detail using FIG. 8(c), in the case where the partial shade arises, the current may vary rapidly in a short time. Therefore, a case where the sampling rate is insufficient to monitor the variation of the current is also conceivable.

Thereupon, the invention according to this embodiment is characterized in that a frequency of a clock supplied to the ADC3 that is an AD converter that analog-to-digital converts the output current and supplies it to the current variation arithmetic logical unit is higher than a frequency of a clock supplied to the AD converter ADC1 and the AD converter ADC2. Such clocks are generated using a frequency divider 1 with a fast sampling rate, and even if a current variation arises by the partial shade in a short time, the current variation can be monitored by them.

Fourth Embodiment

Figure 4:
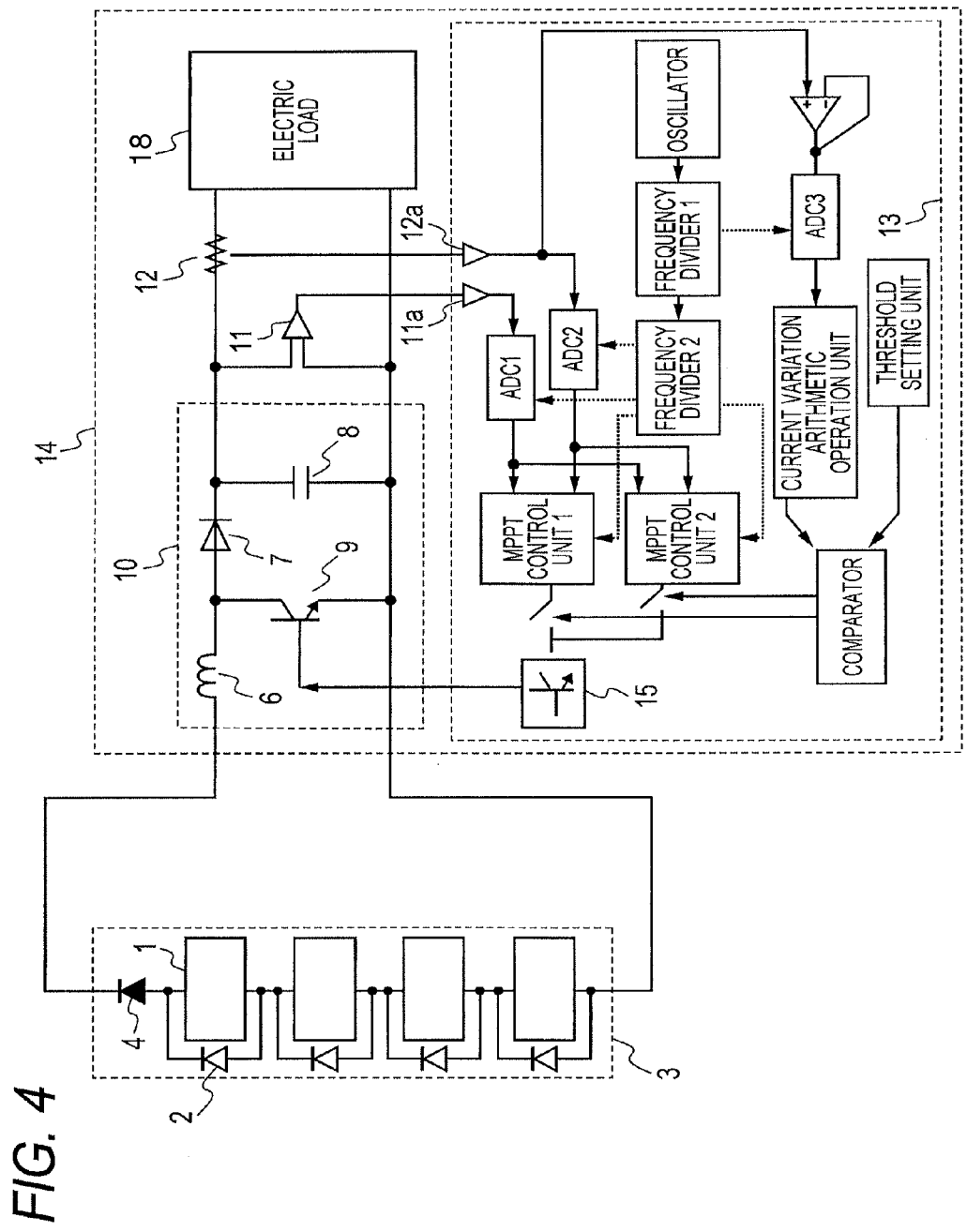
FIG. 4 is a diagram showing an entire configuration of a solar power system according to a fourth embodiment of the present invention.

FIG. 4 is a block diagram of a solar power system according to the third embodiment of the present invention. In the figure, since this system is the solar power system shown in FIG. 3 with the solar cell arrays therein replaced with a string formed by connecting the solar cell modules in series, any component of the same symbol as that of FIG. 3 performs the same operation and therefore its explanation is omitted.

As was described above using FIG. 8, since the main factor by which the solar power has a characteristic of having multiple local solutions is the partial shade cast on the string formed by connecting the solar cell modules in series, it is possible to avoid an operation in a local solution that is not the maximum power point by performing a control by the string as shown in FIG. 4, and this scheme has a merit that the cost does not become large as well because the control is provided in every string.

LIST OF REFERENCE SIGNS

1 ... Solar cell module
2 ... By-pass diode
3 ... Solar cell string
4 ... Back flow preventing diode
5 ... Solar cell array
6 ... Coil
7 ... Diode
8 ... Capacitor
9 ... Switching element
10 ... Boost chopper
11a ... Buffer
11b ... Sensor
12a ... Buffer
12b ... Sensor
13 ... Control unit
14 ... Power conditioner
15 ... Level shifter
18 ... Electric load

The invention claimed is:

1. A solar power system, comprising:
   solar cells;
   a voltage control unit for controlling an output voltage of the solar cells;
   a voltage detection unit for detecting the output voltage of the solar cells;
   a current detection unit for detecting an output current of the solar cells;
   a first control unit that makes the voltage control unit vary the output voltage of the solar cells within a first variation width and compares the output voltages of the solar cells before and after the variation;
   a second control unit that makes the voltage control unit vary the output voltage of the solar cells within a second variation width that is larger than the first variation width and compares the output voltages of the solar cells before and after the variation; and
   a comparison unit for comparing an absolute value of a change amount per unit time of the output current of the solar cells detected by the current detection unit and a predetermined threshold;
   wherein if the comparison unit determines that the absolute value of the change amount is smaller than the predetermined threshold, the first control unit will be selected, and if the comparison unit determines that the absolute value of the change amount is larger than the predetermined threshold, the second control unit will be selected;
   wherein the predetermined threshold is larger than the absolute value of the change amount per unit time of the output current of the solar cells as determined by equation $|dI|=|I/V|*|dV|$, where dI is the change amount per unit time of the output current of the solar cells, I is the output current of the solar cells, V is the output voltage of the solar cells, and dV is a change amount per unit time of the output voltage of the solar cells.

2. The solar power system according to claim 1, wherein the solar cells are a solar cell array that has a plurality of solar cell strings each formed by connecting a plurality of solar cell modules in series and in which the solar cell strings are connected in parallel.

3. The solar power system according to claim 1, wherein the solar cells are a solar cell string formed by connecting a plurality of solar cell modules in series.

4. The solar power system according to claim 1, wherein the predetermined threshold is computed based on the output voltage of the solar cells and the output current of the solar cells.

5. The solar power system according to claim 1, wherein the predetermined threshold is computed based on a temperature of the solar cells and a quantity of solar radiation to the solar cells.

6. The solar power system according to claim 1, further comprising:
   a current variation arithmetic logical unit that computes the change amount and supplies it to the comparison unit;

a first analog-to-digital (AD) converter that analog-to-digital converts the output voltage of the solar cells and supplies it to the first control unit and the second control unit;

a second AD converter that analog-to-digital converts the output current of the solar cells and supplies it to the first control unit and the second control unit; and a third AD converter that analog-to-digital converts the output current of the solar cells and supplies it to the current variation arithmetic logical unit;

wherein a frequency of a clock supplied to the third AD converter is higher than both a frequency of a clock supplied to the first AD converter and a frequency of a clock supplied to the second AD converter.

7. A control system for controlling solar cells, comprising:

a first control unit that varies an output voltage of the solar cells within a first variation width;

a second control unit that varies the output voltage of the solar cells within a second variation width that is larger than the first variation width and compares the output voltages of the solar cells before and after the variation; and a comparison unit that compares an absolute value of a change amount per unit time of an output current of the solar cells and a predetermined threshold;

wherein if the comparison unit determines that the absolute value of the change amount is smaller than the predetermined threshold, the first control unit will be selected, and if the comparison unit determines that the absolute value of the change amount is larger than the predetermined threshold, the second control unit will be selected;

wherein the predetermined threshold is larger than the absolute value of the change amount per unit time of the output current of the solar cells as determined by equation $|dI|=|I/V|*|dV|$, where dI is the change amount per unit time of the output current of the solar cells, I is the output current of the solar cells, V is the output voltage of the solar cells, and dV is a change amount per unit time of the output voltage of the solar cells.

8. The control system according to claim 7,
wherein the solar cells are a solar cell array that has a plurality of solar cell strings each formed by connecting a plurality of solar cell modules in series and in which the solar cell strings are connected in parallel.

9. The control system according to claim 7,
wherein the solar cells are a solar cell string formed by connecting a plurality of solar cell modules in series.

10. The control system according to claim 7,
wherein the predetermined threshold is computed based on the output voltage of the solar cells and the output current of the solar cells.

11. The control system according to claim 7,
wherein the predetermined threshold is computed based on a temperature of the solar cells and a quantity of solar radiation to the solar cells.

12. The control system according to claim 7, further comprising:

a current variation arithmetic logical unit that computes the change amount of the output current of the solar cells and supplies it to the comparison unit;

a first analog-to-digital (AD) converter that analog-to-digital converts the output voltage of the solar cells and supplies it to the first control unit and the second control unit;

a second AD converter that analog-to-digital converts the output current of the solar cells and supplies it to the first control unit and the second control unit; and a third AD converter that analog-to-digital converts the output current of the solar cells and supplies it to the current variation arithmetic logical unit;

wherein a frequency of a clock supplied to the third AD converter is higher than both a frequency of a clock supplied to the first AD converter and a frequency of a clock supplied to the second AD converter.

* * * * *